US011588464B2

United States Patent
Huck et al.

(10) Patent No.: US 11,588,464 B2
(45) Date of Patent: Feb. 21, 2023

(54) TF-SAW RESONATOR WITH IMPROVED QUALITY FACTOR, RF FILTER AND METHOD OF MANUFACTURING A TF-SAW RESONATOR

(71) Applicant: RF360 EUROPE GMBH, Munich (DE)

(72) Inventors: Christian Huck, Munich (DE); Matthias Knapp, Munich (DE)

(73) Assignee: RF360 EUROPE GMBH, Munich (DE)

( * ) Notice: Subject to any disclaimer, the term of this patent is extended or adjusted under 35 U.S.C. 154(b) by 0 days.

(21) Appl. No.: 17/047,796

(22) PCT Filed: Mar. 14, 2019

(86) PCT No.: PCT/EP2019/056439
§ 371 (c)(1),
(2) Date: Oct. 15, 2020

(87) PCT Pub. No.: WO2019/201520
PCT Pub. Date: Oct. 24, 2019

(65) Prior Publication Data
US 2021/0167748 A1     Jun. 3, 2021

(30) Foreign Application Priority Data
Apr. 16, 2018   (DE) .................. 102018108961.9

(51) Int. Cl.
*H03H 9/02*   (2006.01)
*H03H 3/08*   (2006.01)
(Continued)

(52) U.S. Cl.
CPC .......... *H03H 9/02574* (2013.01); *H03H 3/08* (2013.01); *H03H 9/02834* (2013.01);
(Continued)

(58) Field of Classification Search
CPC .. H03H 9/02574; H03H 3/08; H03H 9/02834; H03H 9/02944; H03H 9/145; H03H 9/6489; H03H 9/02559
(Continued)

(56) References Cited

U.S. PATENT DOCUMENTS

2007/0139141 A1*  6/2007  Knollenberg .......... H03H 9/172
                                                         333/191
2012/0032753 A1*  2/2012  Nishimura ......... H03H 9/14526
                                                         333/133
(Continued)

FOREIGN PATENT DOCUMENTS

| EP | 2058946 A1 | 5/2009 |
| EP | 2357729 A1 | 8/2011 |
| WO | 2012100813 A1 | 8/2012 |

OTHER PUBLICATIONS

International Search Report and Written Opinion dated Jul. 3, 2019, corresponding to Application No. PCT/EP2019/056439.
(Continued)

*Primary Examiner* — Rakesh B Patel
*Assistant Examiner* — Jorge L Salazar, Jr.
(74) *Attorney, Agent, or Firm* — Patterson + Sheridan LLP

(57) ABSTRACT

A TF-SAW resonator with improved quality factor is provided. The resonator has its piezoelectric material in the form of a thin film and an electrode structure arranged on the piezoelectric layer. Pitch (P) and metallization ratio (n) are chosen to maximize the quality factor (Q).

19 Claims, 4 Drawing Sheets

(51) Int. Cl.
*H03H 9/64* (2006.01)
*H03H 9/145* (2006.01)

(52) U.S. Cl.
CPC ........ *H03H 9/02944* (2013.01); *H03H 9/145* (2013.01); *H03H 9/6489* (2013.01)

(58) Field of Classification Search
USPC .......................................... 333/133, 193–196
See application file for complete search history.

(56) References Cited

U.S. PATENT DOCUMENTS

| 2017/0222622 | A1* | 8/2017 | Solal | H03H 3/007 |
| 2018/0097508 | A1 | 4/2018 | Iwamoto et al. | |
| 2018/0102760 | A1 | 4/2018 | Inoue et al. | |

OTHER PUBLICATIONS

Figure 1:
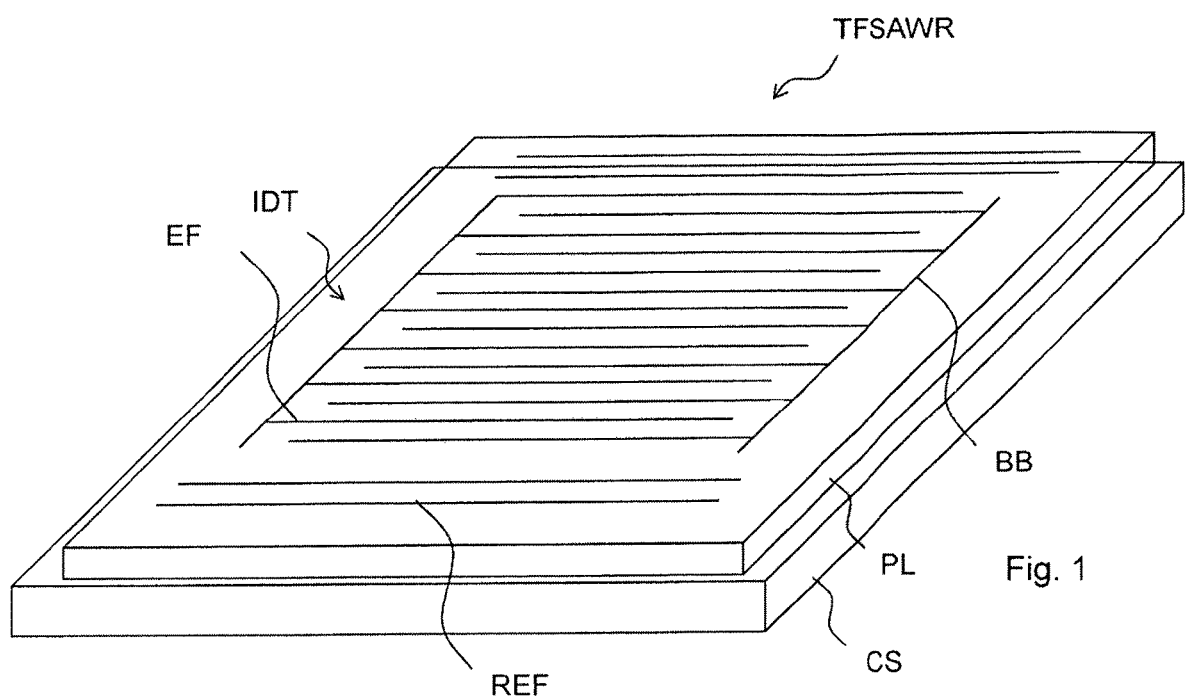
Figure 2:
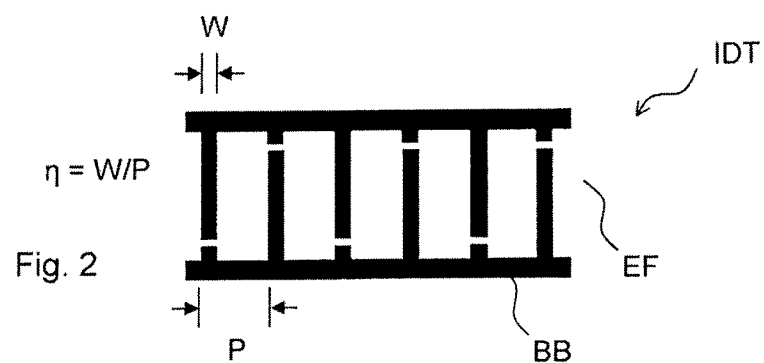

Takai T., et al., "High-Performance SAW Resonator on New Multilayered Substrate Using LiTa03 Crystal", IEEE Transactions on Ultrasonics, Ferroelectrics and Frequency Control, IEEE, US, vol. 64, No. 9, 2017, pp. 1382-1389, XP011659662, [retrieved on Aug. 28, 2017], sections I, II, IV, figures 1,2, Abstract, I. Introduction, p. 1382, Right-Hand Column—p. 1383, Left-Hand Column, II. Concept and Numerical Analysis, p. 1383, Left-Hand Column—p. 1385, Left-Hand Column, Figures 1-6, C. TCF and Electromechanical Coupling Factor, p. 1385, Right-Hand Column—p. 1386, Left-Hand Column, Figure 8, IV. Application of New SAW Resonator to Narrow Duplex Gap Duplexer, p. 1386, Right-Hand Column—p. 1387, Right-Hand Column, Figures 11, 12.

Ueda M., et al., "Ultra-Miniaturized and High Performance PCS SAW Duplexer with Steep Cut-Off Filters", Microwave Symposium Digest, 2004 IEEEMTT-S International Fort Worth. TX, USA, Jun. 6-11, 2004, Piscataway, NJ, USA, IEEE, vol. 2, Jun. 6, 2004 (Jun. 6, 2004), pp. 913-916, XP010728273, DOI: 10.1109/MWSYM.2004.1339121 ISBN: 978-0-7803-8331-9 II. New SAW Design for PCS-Duplexer, A. Loss Analysis of SAW Resonators, p. 913, Right-Hand Column—p. 914, Right-Hand Column, Figures 1-3.

* cited by examiner

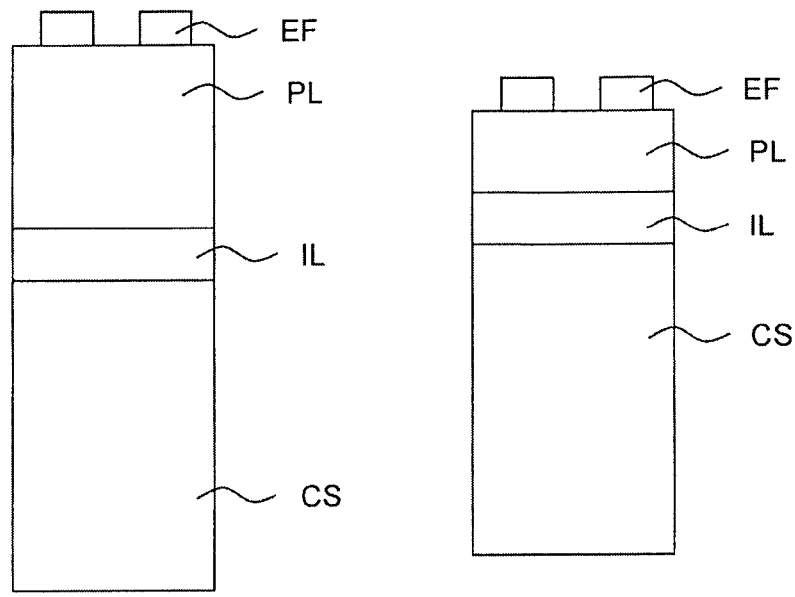
Fig. 5
Fig. 6
Fig. 7
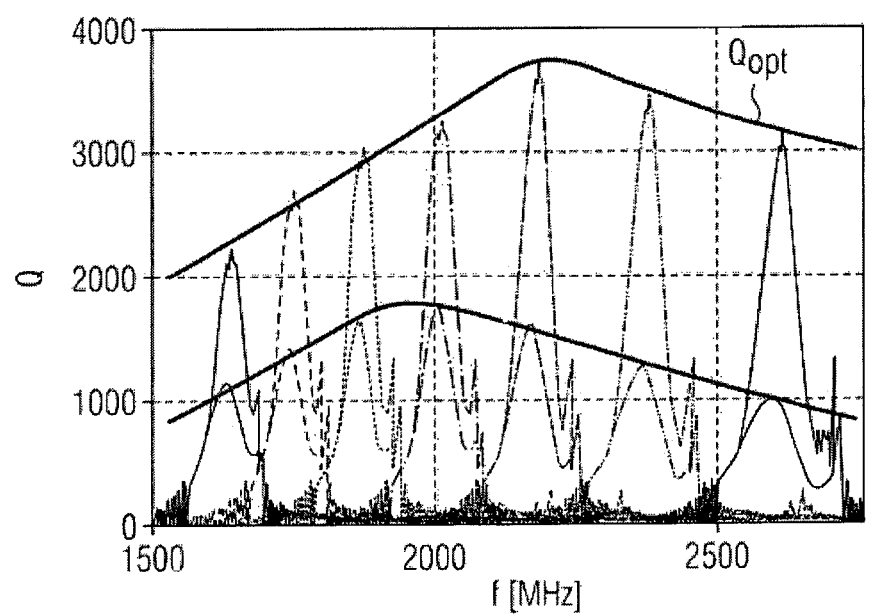

Fig. 8
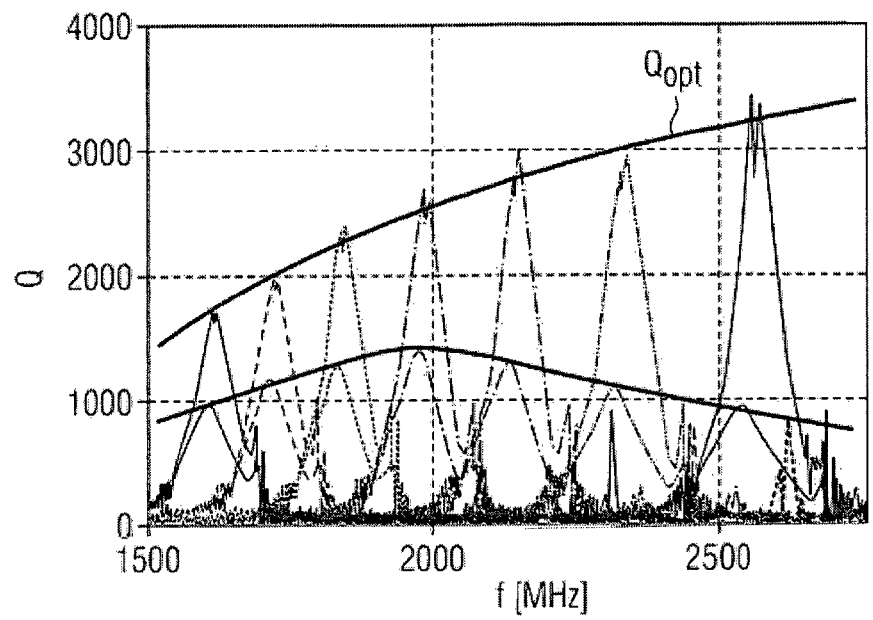
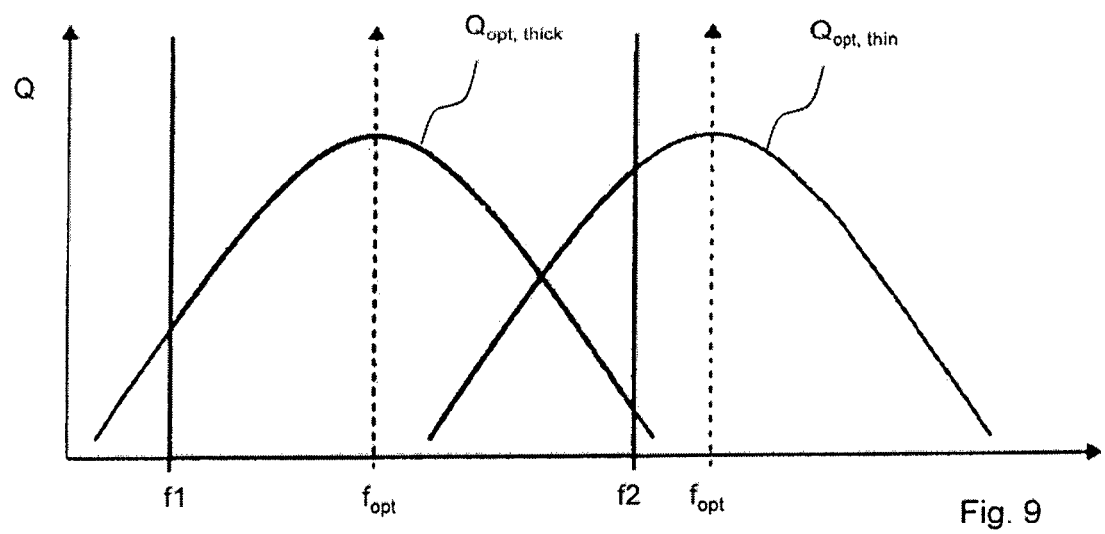
Fig. 9

TF-SAW RESONATOR WITH IMPROVED QUALITY FACTOR, RF FILTER AND METHOD OF MANUFACTURING A TF-SAW RESONATOR

CROSS-REFERENCE TO RELATED APPLICATIONS

This application is a national stage application under 35 U.S.C. 371 of PCT/EP2019/056439, filed Mar. 14, 2019, which claims the benefit of German Application No. 102018108961.9, filed Apr. 16, 2018, both of which are incorporated herein by reference in their entireties.

The present invention refers to electroacoustic resonators having an IDT structure on a thin layer comprising a piezoelectric material (TF-SAW resonator) that can be utilized in RF filters for mobile communication devices. Further, the invention refers to RF filters and methods of manufacturing such resonators and filters.

In mobile communication devices electroacoustic resonators can be utilized to establish RF filters. Electroacoustic resonators have a piezoelectric material and an electrode structure comprising interdigitated electrode fingers arranged on the piezoelectric material. Due to the piezoelectric effect such a resonator can convert between RF signals and acoustic waves. In particular TF-SAW resonators are characterized by having a piezoelectric material provided in the form of a thin film created with wafer bonding and thin film processing techniques or thin film layer deposition techniques such as sputtering, physical vapor deposition, chemical vapor deposition, molecular beam epitaxy and the like.

Two or more such resonators can be combined to establish a bandpass filter or a band rejection filter. RF filters should fulfil a selection of specifications, e.g. concerning insertion loss, bandwidth, passband skirt steepness and the like. One important characteristic number of an individual resonator is its quality factor (Q factor). The quality factor has an impact on the performance of the corresponding RF filter.

Thus, an electroacoustic resonator with an improved quality factor is wanted.

Compared with conventional electroacoustic resonators working with surface acoustic waves, TF-SAW resonators are a relatively new type of resonator and due to the different type of construction—compared to conventional SAW resonators having an IDT structure on a single crystalline piezoelectric bulk substrate—means for optimizing the quality factor of a conventional SAW resonator may not necessarily work with TF-SAW resonators.

A TF-SAW resonator with an improved quality factor, an RF filter comprising such resonators and a method of manufacturing a TF-SAW resonator according to the independent claims are provided. Dependent claims provide preferred embodiments.

The TF-SAW resonator with an improved quality factor comprises a carrier substrate and a piezoelectric layer on or above the carrier substrate. The piezoelectric layer has a thickness T. Further, the resonator comprises an electrode structure comprising an IDT structure on the piezoelectric layer. The IDT structure (IDT=interdigital transducer) has a pitch P and a metallization ratio $\eta$. The piezoelectric layer is a thin film and comprises a piezoelectric material. The pitch P and the metallization ratio $\eta$ are chosen to maximize the quality factor Q.

It is possible that the pitch P and the metallization ratio $\eta$ depend on the thickness T of the piezoelectric layer.

In such a resonator the carrier substrate acts as a carrier for the structures, layers and components arranged on or above the carrier substrate. The piezoelectric layer comprises the piezoelectric material needed to employ the piezoelectric effect to convert between RF signals and acoustic waves. The piezoelectric layer is a thin film. That is, the piezoelectric layer is provided utilizing wafer bonding with thin film processing or a thin film layer deposition technique. The electrode structure comprises an IDT structure. The IDT structure has electrode fingers electrically connected to one of at least two busbars. Via the electrode fingers RF signals are provided at the surface of the piezoelectric layer.

It is preferred that the piezoelectric material has its matter provided, arranged and oriented in such a way that a piezoelectric axis is obtained. It is preferred that the piezoelectric axis is oriented relative to the propagation direction of the acoustic waves, e.g. according to selected Euler angles.

The pitch is a characteristic value of the IDT and at least locally defined as the distance between two edges of adjacent electrode fingers, the edges pointing in the same direction.

Each electrode finger has a uniform or a specific finger width W. The finger spacing is defined as the distance between two adjacent electrode fingers. Thus, the pitch is defined as the sum of the finger width and the finger spacing with respect to two adjacent electrode fingers.

Correspondingly, the metallization ratio $\eta$ is defined as the finger width W divided by the pitch P: $\eta=W/P$.

It was found that in TF-SAW resonators the quality factor of such a resonator has a specific dependence on the pitch, a specific dependence on the metallization ratio and a specific dependence on the thickness of the piezoelectric material. In particular the thickness dependence substantially distinguishes the quality factor of a TF-SAW resonator from the quality factor of a conventional SAW resonator with electrode structures arranged on a piezoelectric bulk material. Thus, the thin film characteristic of the piezoelectric layer becomes important and plays a major role in determining the resonator's characteristic properties.

It is possible that the piezoelectric material comprises lithium niobate ($LiNbO_3$) or lithium tantalate ($LiTaO_3$). It is also possible that the piezoelectric material consists of lithium niobate or lithium tantalate.

It is further possible that the TF-SAW resonator further comprises an intermediate layer between the carrier substrate and the piezoelectric layer. The acoustic velocity in the intermediate layer is smaller than in the piezoelectric layer.

Such an intermediate layer with its acoustic velocity being smaller than the acoustic velocity in the piezoelectric layer helps to establish an acoustic waveguide in the sagittal plane and to confine acoustic energy to the surface of the resonator.

It is possible that the intermediate layer comprises a silicon oxide, e.g. a silicon dioxide.

Further, the TF-SAW resonator can comprise a TCF layer (TCF=temperature coefficient of frequency) between the carrier substrate and the piezoelectric layer. Such a TCF layer helps to reduce the temperature dependence of characteristic frequencies, e.g. the resonance frequency or the anti-resonance frequency of the resonator. To that end, the TCF layer can have a dependence of the stiffness parameters on the temperature that is opposite to that of the piezoelectric material.

It is possible that the TF-SAW resonator further comprises a charge reduction layer. Such a layer can also be regarded as a trap rich layer as it is provided to contain traps to trap electric charge.

The charge reduction layer, e.g. known as a trap rich layer, can be used to reduce parasitic surface conduction by trapping free charge carriers. Polycrystalline Si can be used as a material for the charge reduction layer.

It is possible that the method further comprises locally trimming the thickness T of the piezoelectric layer individually for each resonator.

It is possible that the dependence of the pitch P and the metallization ratio η on the thickness T of the piezoelectric layer is modified/disturbed by the external electric environment of the resonator.

It is possible that the electroacoustic transducer comprises a passivation layer, a trimming layer, a temperature compensation layer, a sagittal waveguiding layer and/or a charge reduction layer.

The sagittal waveguiding layer has a reduced acoustic velocity compared to the piezoelectric layer and is preferably arranged below the piezoelectric layer.

The charge reduction layer, e.g. known as a trap rich layer, can be used to reduce parasitic surface conduction by trapping free charge carriers. Polycrystalline Si can be used as a material for the charge reduction layer.

The trimming layer can comprise a material that is at least locally arranged on or above the electrode structures and can be used to trim the mass loading to a preferred operation frequency.

The trimming layer can comprise a dielectric material such as silicon nitride.

The temperature compensation layer can be arranged above or on the piezoelectric material or—preferably—below the piezoelectric material.

The trimming layer is preferably arranged on or above the piezoelectric layer.

The passivation layer is preferably arranged on or above the piezoelectric layer and can comprise $Si_3N_4$ or $SiO_2$.

The material of the passivation layer can also establish the material of the trimming layer.

The charge reduction layer is preferably arranged between the carrier and the sagittal wave guide layer.

The temperature compensation layer can comprise a silicon oxide such as silicon dioxide and can be used to counteract temperature-induced frequency drifts to maintain stable operating frequencies over a wide temperature range.

It was found that by using conventional means for determining the quality factor of a resonator the results may be distorted due to the external circuit environment of an individual resonator, e.g. caused by electric properties of connection, e.g. electromagnetic losses originating from connection pads outside the acoustic track. Such losses can substantially dominate the measured quality factor clouding the real quality factor of the transducer itself. Thus, such artefacts must be compensated by measuring techniques that focus on the acoustics and the electric properties of the transducer itself.

It is possible to determine the optimum pitch P and the metallization ratio η for a specific thickness T without artefacts from the external circuit environment of the resonator by de-embedding the electromagnetic losses originating from pads outside the acoustic track. De-embedding can be performed by means of open circuit and short circuit structures.

Since the electromagnetic losses of the electric environment may be increased due to the PSC (parasitic surface conduction) layer in TF-SAW resonators, de-embedding is especially relevant in TF-SAW resonators without a trap rich layer compensating the PSC effect.

An RF filter can comprise two or more such TF-SAW resonators. In a corresponding RF filter the pitch P and the metallization ratio η are chosen for each resonator individually.

Then, the corresponding RF filter bases on resonators having improved quality factors and can provide an improved filter characteristic to its electrical environment.

It is possible to determine the pitch P and the metallization ratio η dependent on the thickness T without artefacts from the external circuit environment of the resonator by de-embedding the electromagnetic losses originating from pads outside the acoustic track. De-embedding can be performed by means of open circuit and short circuit structures.

A method of manufacturing a TF-SAW resonator can comprise the steps:
  providing a carrier substrate,
  providing a piezoelectric layer comprising a piezoelectric material on or above the carrier substrate utilizing wafer bonding with thin film processing or a thin film layer deposition technique,
  structuring an electrode structure comprising an IDT structure on the piezoelectric layer with a pitch P and a metallization ratio η chosen to maximize the quality factor Q.

This method provides the improved TF-SAW resonator described above.

Further, it is possible that the method is performed such that pitch P and metallization ratio η are chosen considering the thickness T of the piezoelectric layer but are independent from the external circuit environment of the resonator.

This can be achieved by de-embedding the resonator structure, e.g. via the use of open circuit structures or short circuit structures.

Central aspects of the TF-SAW resonator, the RF filter and the method and details of preferred embodiments are shown in the accompanying schematic figures.

Figure 3:
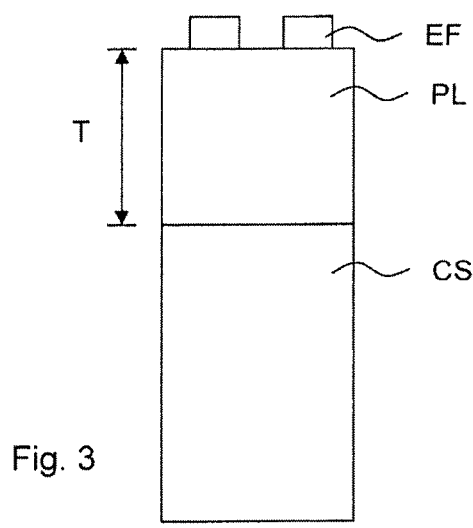
Figure 4:
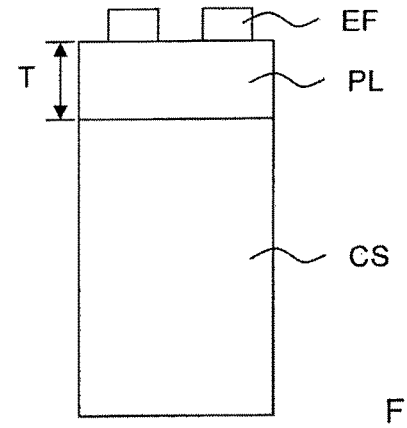
Figure 10:
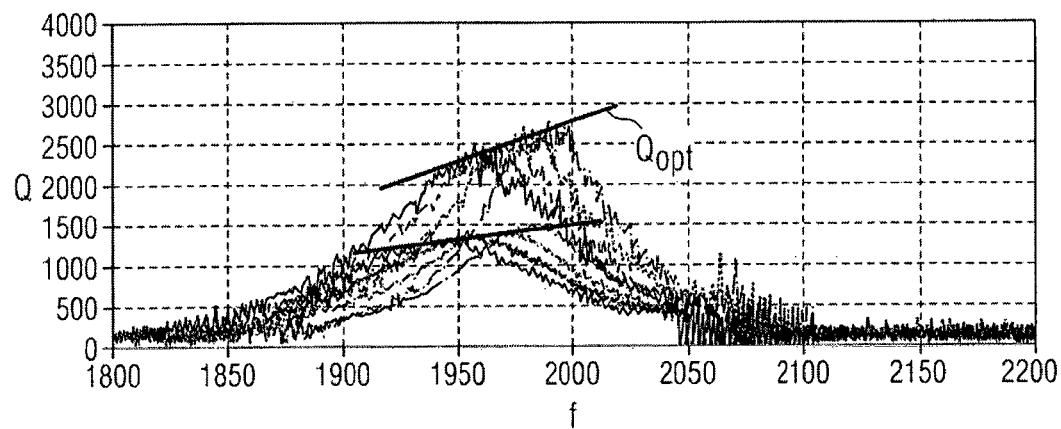
Figure 11:
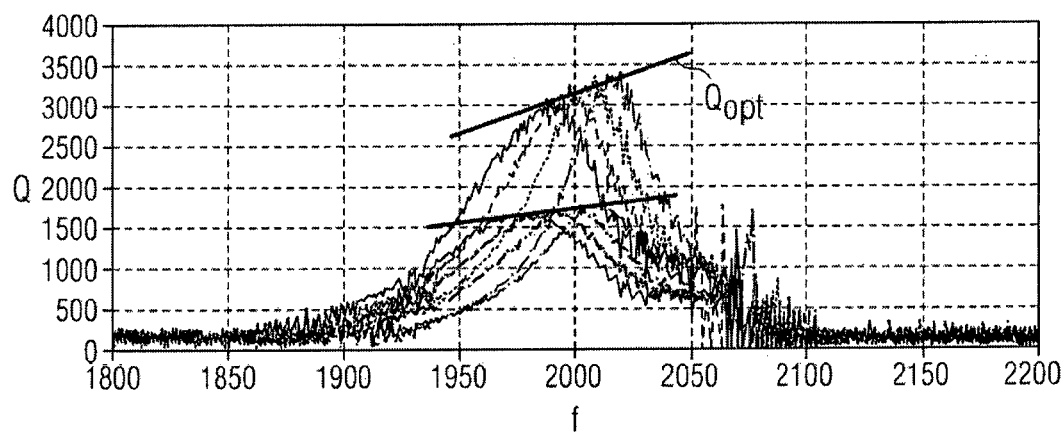

In the figures:
  FIG. 1 shows a perspective view of a TF-SAW resonator;
  FIG. 2 illustrates the definitions of the pitch P and the metallization ratio η;
  FIG. 3 illustrates a possible layer construction in a cross-section;
  FIG. 4 illustrates a possible layer construction with a smaller thickness of the piezoelectric layer;
  FIG. 5 shows a layer construction having an intermediate layer;
  FIG. 6 illustrates a layer construction having an intermediate layer and a smaller thickness of the piezoelectric layer;
  FIG. 7 illustrates quality factors for varying pitches determined with and without de-embedding for a thick piezoelectric layer;
  FIG. 8 illustrates quality factors for varying pitches determined with and without de-embedding for a thin piezoelectric layer;
  FIG. 9 illustrates an overview over obtained maximum quality factors for both piezoelectric layer thicknesses;
  FIG. 10 shows quality factors for varying metallization ratios determined with and without de-embedding for a thick piezoelectric layer; and
  FIG. 11 shows quality factors for varying metallization ratios determined with and without de-embedding for a thin piezoelectric layer.

FIG. 1 illustrates a possible construction of a thin film-SAW resonator TFSAWR in a perspective view. The elements of the resonator are arranged on a carrier substrate CS. In particular, a piezoelectric layer PL comprising a piezoelectric material or consisting of a piezoelectric material is arranged and deposited on the carrier substrate CS. On the piezoelectric layer PL an interdigital structure IDT is arranged and structured. The interdigital structure comprises electrode fingers EF that are electrically connected to one of two busbars BB. Thus, the interdigital transducer has its electrode fingers arranged in a comb-like pattern to convert between RF signals and acoustic waves via the electroacoustic effect.

In the longitudinal direction the interdigital transducer IDT is flanked by reflectors RF comprising reflection fingers for confining acoustic energy longitudinally to the acoustic track.

FIG. 2 illustrates a possible IDT geometry. The pitch P is defined as the distance between two edges of adjacent electrode fingers that point in the same direction. Thus, the pitch P is defined as the sum of the width W of an electrode finger and the distance between the electrode finger and the adjacent electrode finger. The metallization ratio η is defined as W/P.

FIG. 3 illustrates a cross-section in the sagittal plane through the layer construction. The piezoelectric layer PL with its piezoelectric material is arranged on the carrier substrate CS. On the top side of the piezoelectric layer PL the electrode fingers EF are arranged. T denotes the thickness of the piezoelectric layer in a vertical direction.

In contrast to the layer construction of FIG. 3, FIG. 4 illustrates a layer construction where the thickness T of the piezoelectric layer PL is smaller.

FIGS. 5 and 6 show corresponding layer constructions for a thicker piezoelectric layer PL (FIG. 5) and a thinner piezoelectric layer PL (FIG. 6), each having an intermediate layer IL between the piezoelectric layer PL and the carrier substrate.

The intermediate layer can comprise or consist of a material having a smaller acoustic velocity compared to the piezoelectric layer. Thus, a waveguide confining acoustic energy to the piezoelectric layer is obtained.

Further, it is possible that the intermediate layer IL or an additional layer comprises material of a TCF layer for reducing or eliminating frequency drifts of characteristic frequencies as a result of temperature changes.

FIG. 7 illustrates a plurality of measured quality factors for a layer construction having a specific thickness of the piezoelectric layer. The curves corresponding to the higher quality factors are measured utilizing a de-embedding method for neglecting measuring artefacts caused by the resonator's electric environment outside the acoustic track. The quality factors with the lower Q value, however, are obtained utilizing conventional means for determining the quality factor without de-embedding of the electric environment.

It can be clearly seen that the real quality factors are different from the quality factors obtained by conventional measuring means. Further, it can be seen that the frequency range of the optimal quality factors $Q_{opt}$ for the real values is shifted compared to the maximum quality factor that would be obtained by conventional measuring means.

The plurality of quality factors correspond to different pitches, thus, illustrating the effect of pitch variation on maximum quality factors.

It can be clearly seen that conventional measuring means would suggest a pitch that has its highest quality factor at around 2000 MHz or slightly below 2000 MHz while the real optimum quality factor is obtained at around 2200 MHz for a different pitch.

Thus, FIG. 7 clearly shows that the provided methods for establishing resonators provide resonators with improved quality factors.

The same arguments hold true for a layer construction with a thinner piezoelectric layer as shown in FIG. 8. Similarly to FIG. 7, FIG. 8 would suggest an optimum Q factor when the pitch is varied for around 2000 MHz while the actual optimum Q value is obtained at frequencies above 2500 MHz.

The results of the above considerations are shown in FIG. 9. Two frequency-dependent quality factors for the optimum quality factor are shown. For a layer construction having a thicker piezoelectric layer the optimum quality factor is obtained at a lower frequency. For the layer construction based on a thinner piezoelectric layer the frequency range is shifted to higher frequencies. However, if only conventional means for determining the quality factor would be applied, then the frequency range for the optimum quality factor would be nearly independent of the piezoelectric layer thickness since electromagnetic artefacts from the environment outside of the acoustic track dominate the quality factor and the real quality factor of the acoustic track itself is clouded. In particular for the layer construction having the smaller thickness of the piezoelectric layer, the frequency for the best quality factor would be outside the interval and would not be considered.

FIG. 10 shows a plurality of measured quality factors for a thick piezoelectric layer. The curves with the higher quality factors correspond to results with de-embedding while the curves with the lower quality factors correspond to results without de-embedding. The plurality of quality factor measurements correspond to different metallization ratios η.

Similarly, FIG. 11 shows the measured quality factors corresponding to FIG. 10 while the results shown in FIG. 11 are based on a layer construction with a thinner piezoelectric layer.

In both cases it can be seen that the quality factor can be maximized by optimizing the metallization ratio.

Thus, FIGS. 7 to 9 show that the real quality factor has a strong pitch dependence. FIGS. 10 and 11 show that the quality factor has a η dependence. FIGS. 7 to 11 show that conventional methods for determining the quality factor do not provide the actual quality factor and only when the preferred measures for determining the quality factor by means of de-embedding are performed, then the real quality factors can be determined and correspondingly improved resonators and RF filters can be obtained.

The resonator, the filter and the method are not limited to the technical details shown and explained above. The resonator can comprise further structures. Further means, e.g. apodization, slanting or the structuring of further means for establishing a transversal acoustic waveguide, e.g. FINEA (FINger-Enden-Aufdickung) piston mode, are also possible.

LIST OF REFERENCE SIGNS

BB: busbar
CS: carrier substrate
EF: electrode finger
IDT: interdigital transducer structure
IL: intermediate layer
$Q_{opt}$: optimal quality factor
PL: piezoelectric layer
P: pitch
REF: reflector
T: thickness of the piezoelectric layer
TFSAWR: thin film-SAW resonator
W: width of electrode finger

The invention claimed is:

1. A thin-film surface acoustic wave (TF-SAW) resonator, comprising:
    a carrier substrate;
    a piezoelectric layer on or above the carrier substrate, the piezoelectric layer having a thickness T;
    a charge reduction layer arranged between the carrier substrate and the piezoelectric layer; and
    an electrode structure comprising an interdigital transducer (IDT) structure on the piezoelectric layer, the IDT structure having a pitch P and a metallization ratio η, wherein:
    the piezoelectric layer is a thin film comprising a piezoelectric material, and
    the pitch P and the metallization ratio η maximize a quality factor Q of the TF-SAW resonator.

2. The TF-SAW resonator of claim 1, wherein P and η depend on the thickness T of the piezoelectric layer.

3. The TF-SAW resonator of claim 1, wherein the piezoelectric material comprises $LiNbO_3$ or $LiTaO_3$.

4. The TF-SAW resonator of claim 1, further comprising an intermediate layer between the carrier substrate and the piezoelectric layer, wherein an acoustic velocity in the intermediate layer is smaller than in the piezoelectric layer.

5. The TF-SAW resonator of claim 1, further comprising a temperature compensation layer between the carrier substrate and the piezoelectric layer.

6. An RF filter comprising two or more TF-SAW resonators of claim 1, wherein P and η are chosen for each resonator individually.

7. The TF-SAW resonator of claim 1, wherein P and η depend on the thickness T of the piezoelectric layer, but are independent from an external electric environment of the resonator.

8. A method of manufacturing a thin-film surface acoustic wave (TF-SAW) resonator, comprising:
    depositing a piezoelectric layer comprising a piezoelectric material on or above a carrier substrate utilizing wafer bonding with thin film processing or a thin film layer deposition technique;
    arranging a charge reduction layer between the carrier substrate and the piezoelectric layer; and
    structuring an electrode structure comprising an interdigital transducer (IDT) structure on the piezoelectric layer with a pitch P and a metallization ratio η chosen to maximize a quality factor Q of the TF-SAW resonator.

9. The TF-SAW resonator of claim 8, wherein the charge reduction layer comprises polycrystalline silicon.

10. The method of claim 8, wherein P and η are chosen considering a thickness T of the piezoelectric layer but are independent from an external electric environment of the resonator.

11. The method of claim 8, further comprising locally trimming a thickness T of the piezoelectric layer.

12. The TF-SAW resonator of claim 8, wherein P and η depend on a thickness T of the piezoelectric layer.

13. The TF-SAW resonator of claim 8, wherein the piezoelectric material comprises $LiNbO_3$ or $LiTaO_3$.

14. A radio frequency (RF) filter comprising two or more thin-film surface acoustic wave (TF-SAW) resonators, the TF-SAW resonators comprising:
    a carrier substrate;
    a piezoelectric layer on or above the carrier substrate, the piezoelectric layer having a thickness T; and
    an electrode structure comprising an interdigital transducer (IDT) structure on the piezoelectric layer, the IDT structure having a pitch P and a metallization ratio η, wherein:
    P and η are chosen for each TF-SAW resonator individually,
    the piezoelectric layer is a thin film comprising a piezoelectric material, and
    the pitch P and the metallization ratio η maximize a quality factor Q of the TF-SAW resonator.

15. The RF filter of claim 14, wherein P and η depend on the thickness T of the piezoelectric layer, but are independent from an external electric environment of the resonators.

16. The RF filter of claim 14, wherein P and η depend on the thickness T of the piezoelectric layer.

17. The RF filter of claim 14, wherein the piezoelectric material comprises $LiNbO_3$ or $LiTaO_3$.

18. The RF filter of claim 14, wherein the TF-SAW resonators further comprise an intermediate layer between the carrier substrate and the piezoelectric layer, wherein an acoustic velocity in the intermediate layer is smaller than in the piezoelectric layer.

19. The RF filter of claim 14, wherein the TF-SAW resonators further comprise a temperature compensation layer between the carrier substrate and the piezoelectric layer.

* * * * *